United States Patent [19]
Schierding et al.

[11] 3,944,393
[45] Mar. 16, 1976

[54] APPARATUS FOR HORIZONTAL PRODUCTION OF SINGLE CRYSTAL STRUCTURE

[75] Inventors: Royce Gene Schierding, St. Charles; John Russell Young, Jr., Florissant; David Louis Vadnais, St. Charles, all of Mo.

[73] Assignee: Monsanto Company, St. Louis, Mo.

[22] Filed: Nov. 21, 1973

[21] Appl. No.: 417,857

[52] U.S. Cl................ 23/273 SP; 156/616; 423/87
[51] Int. Cl.²........................................... B01D 9/00
[58] Field of Search.......... 23/273 SP, 294, 301 SP, 23/305

[56] References Cited
UNITED STATES PATENTS 3,767,473  10/1973  Ayel et al........................ 23/301 SP
3,796,548  3/1974  Boss et al........................ 23/273 SP

*Primary Examiner*—Norman Yudkoff
*Assistant Examiner*—M. G. Mullen
*Attorney, Agent, or Firm*—Peter S. Gilster

[57] ABSTRACT

A seed holder for holding a seed crystal of gallium arsenide (GaAs) is fitted into one end of a cylindrical quartz boat in which a melt of gallium (Ga) and arsenic (As) is synthesized and then grown as a single crystal seeded by the seed crystal using the Bridgeman process or the gradient freeze process. The seed holder closely encompasses three sides of a crystal (e.g., of rectangular cross section) while exposing only the end upon which the crystal growth is to take place. The exposed end of the crystal seed is disposed above the bottom of the boat to prevent contact between the gallium melt and the seed until synthesis is nearly complete.

5 Claims, 4 Drawing Figures

APPARATUS FOR HORIZONTAL PRODUCTION OF SINGLE CRYSTAL STRUCTURE

BACKGROUND OF THE INVENTION

1. Field of the Invention

The present invention is directed to the growth of single crystal structures from a seed crystal and more specifically to an improved seed holder for use with a conventional cylindrical quartz boat during the growth process.

2. Prior Art

Gallium arsenide (GaAs) is a III–V compound semiconducting material whose properties make it of interest for certain applications such as light emitting diodes, laser diodes, Gunn diodes, high temperature rectifiers and the like. In most applications gallium arsenide must be a single crystal with certain electrical and structural properties.

Several methods may be used to grow bulk single crystal gallium arsenide. In the well known Czochralski method and variations thereof, a single crystal seed is caused, by mechanical or magnetic means, to contact the surface of a melt of the material to be crystallized, and slowly withdrawing the seed, usually with rotation, at a rate which permits the melt to freeze progressively onto the seed as a growing ingot of single crystal material.

Other methods for growing single crystal materials wherein seeds have been used for initiating crystal growth include horizontally disposed operations such as the Bridgeman and the gradient freeze techniques.

The temperature gradient freeze method generally consists of placing polycrystalline material in a crucible, melting the polycrystalline material in the crucible and placing the crucible in a tubular furnace which is capable of producing a temperature gradient along its length so that it is hotter at one end than the other. As the temperature of the furnace is reduced and the gradient is shifted, a portion of material within the crucible will freeze causing a solid-liquid interface. Thus, when the gradient has shifted to a point below the freezing point of the material, a single crystal structure is formed within the crucible. Such a method is disclosed in U.S. Pat. No. 3,242,015 to Harris.

The Bridgeman technique is exemplified in U.S. Pat. No. 3,520,810 to Plaskett el al wherein a seed crystal is disposed in one end of a quartz boat having a supply of polycrystalline material such as gallium in the other end of the boat. The boat is placed in an ampoule along with a supply of arsenic adjacent the end of the boat having the seed therein. The ampoule is evacuated, sealed and partially inserted into a furnace to first melt the polycrystalline material. The gallium is permitted to melt and in doing so, reacts with the arsenic to form a gallium arsenide melt which will contact the exposed end face of the seed crystal. The ampoule is only partially inserted into the furnace so that upon programmed heating of the ampoule, the arsenic vaporizes and reacts with molten gallium to form gallium arsenide and provide the necessary arsenic vapor over the melt to stabilize and equilibrate the melt. However, such a method was generally unsuccessful since the molten gallium and unequilibrated gallium arsenide were attacking the seed crystal, dissolving arsenic atoms therefrom, melting the gallium atoms and nucleating polycrystalline growth.

In order to overcome the foregoing difficulties, it has now been proposed to locate the seed end of a crucible or boat at an elevated position within the furnace to prevent the molten gallium and unequilibrated gallium from initially contacting the seed crystal by providing a gradual incline for the bottom surface of the boat. In operation, when the more volatile component of a compound to be formed is vaporized and begins to react with the molten less volatile components, the increasing volume of unsaturated melt moves up the inclined bottom of the crucible toward the seed. By the time the melt has reached the seed crystal, the compound has been formed and equilibrated so that upon subsequent cooling of the melt, the seeded crystal growth will yield an ingot of single crystal compounds.

SUMMARY OF THE INVENTION

The present invention provides an improved seed holder for use with a conventional crucible or boat which is capable of holding a relatively small, precision cut crystallographically oriented seed at an elevated position above the bottom surface of the boat to prevent contact of the melt with the exposed end of the seed crystal until such time as the melt has been equilibrated.

The present invention provides an improved seed holder which can be reused many times, which is of simple construction, easy to fabricate and economical in use.

The present invention provides an improved seed holder which will provide a greatly increased yield of single crystals having a greatly improved material structure.

The foregoing and other objects, features and advantages of the invention will be apparent from the following more particular description of a preferred embodiment of the invention as illustrated in the accompanying drawings.

DETAILED DESCRIPTION OF THE INVENTION

Figure 3:
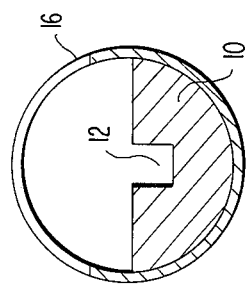
FIG. 3 is a view taken along the line 3—3 in FIG. 1.
Figure 1:
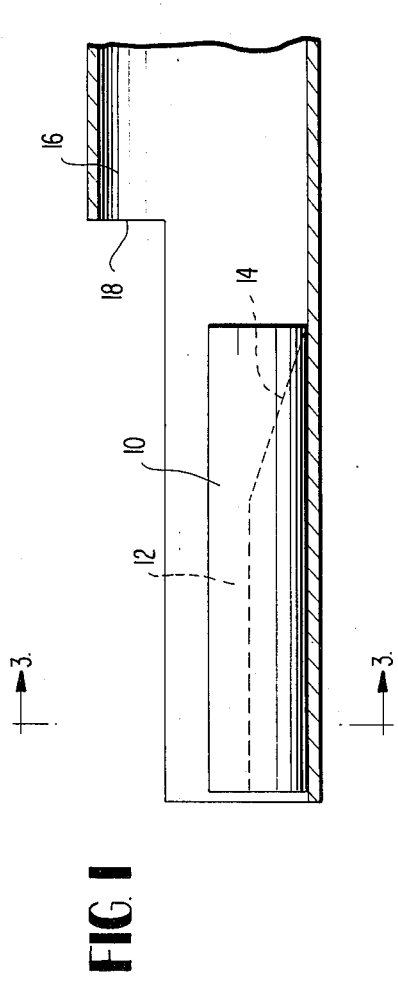
FIG. 1 is a side elevation view showing the relationship of the seed holder within a cylindrical boat.
Figure 2:
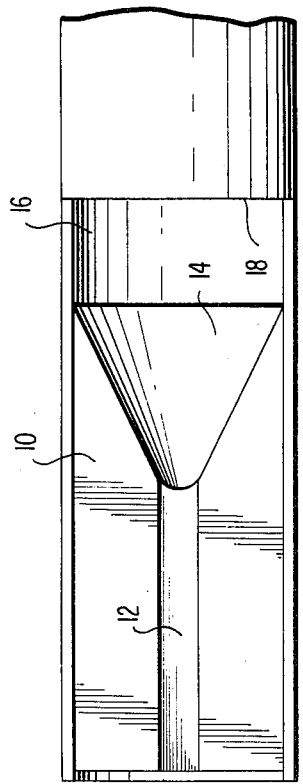
FIG. 2 is a top plan view of the arrangement shown in FIG. 1

The seed holder 10 as shown in FIGS. 1–3 is machined from a solid piece of quartz and consists of a half cylinder with a square cross-section slot 12 machined into the flat upper surface of the holder. The length of the slot is approximately ⅔ the length of the holder and the slot 12 ends in a conical ramp 14 which tapers downwardly and outwardly tp the cylindrical bottom surface of the holder. The seed holder has a diameter comparable to the inside diameter of a conventional cylindrical boat or crucible 16. The cylindrical boat 16 may be partially cut away at 18 to provide ready access to the crystal holder for loading the same into the boat.

Figure 4:
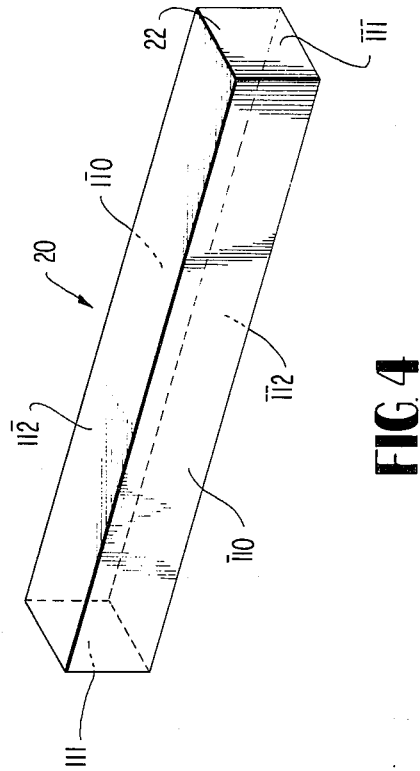
FIG. 4 is a perspective view of a seed crystal showing the orientation of the faces as defined by the Miller indices.

By using the seed holder 10 according to the present invention, it is possible to use a much smaller seed which will only represent a small fraction of the ingot to be produced. The seed, such as the seed 20 shown in FIG. 4, is precision cut by a diamond saw blade into a rectangular configuration to fit the precision machine slot 12 in the upper surface of the holder 10. The crystallographic direction of the seed crystal is essentially parallel to the longitudinal direction of the seed and therefore, parallel to the longitudinal axis of the crucible or boat 16 into which it will be inserted thus presenting the desired crystallographic plane perpendicular to the longitudinal axis of the crucible. When the crystal 20 is inserted into the slot 12 of the holder 10, the surface 22 upon which the crystal growth will take place will be disposed at the intersection of the end of the slot 12 and the conical ramp 14.

EXAMPLE 1

A quartz boat, 15 inches long made from 35mm ID × 38mm OD tubing is uniformly abraided on its inside surface. About 400 grams of high purity gallium is charged to the boat. The quartz seed holder and seed are placed in the boat as shown in FIG. 1. Seed orientation is as shown in FIG. 2 with the face 22 disposed at the top of the conical ramp 14. The boat contents are placed in a 40 mm ID × 43 mm OD quartz tubing, hereafter called the reactor, which is attached to a high vacuum system. The reactor and contents are heated under vacuum to 750°C. and held for 12 hours. The reactor is sealed under vacuum. High purity arsenic is then charged to another quartz tube, 40 mm ID × 43 mm OD, hereafter called the cell. The cell is attached to the reactor at a point where there is a breakseal separating the two chambers. The cell is attached to a high vacuum system and heated to 350° C. for two hours and sealed under vacuum. The breakseal between the two chambers is broken by means of an iron rod encapsulated in quartz which had previously been placed in the cell. The reactor and cell are placed in a seven heat zone furnace as described in U.S. Pat. No. 3,242,015 to Harris.

The temperature of the furnace is raised such that the cell is heated to about 630°C. at about the same time or after the reactor has reached about 630°C. The cell remains at this temperature while the reactor is heated such that the temperature gradient of about 40°–50° is established along the length of the boat, the lowest temperature of the gradient, about 1235° C., being at the seed end. The temperature of the gallium is above the freezing point of gallium arsenide. Arsenic vapor pressure at 630° C. is slightly greater than one atmosphere so that arsenic and gallium synthesize under these conditions to form gallium arsenide. Sufficient excess arsenic is added to maintain 1 atmosphere internal pressure. When synthesis is complete after three to four hours, the temperature along the boat is raised to a level ascertained by experience to give the proper "melt-back" onto the seed. The temperature gradient along the boat is lowered slowly at about 0.4°C/hour until all of the gallium arsenide is crystallized. The boat is then cooled at about 100°–150°C/hour to about 400°C when power to the furnace is shut off.

Table I shows the yield data obtained from 8 runs made using the improved seed crystal holder. The 72% single crystal yield compares very well with the 45–50% yield typical of the prior art techniques. Furthermore, the percentage of the single crystal in Table I having dislocation density less than $10^5/cm^2$ is substantially greater than the prior art crystals.

Table I

| Run | Charge (Gms.) | Single Crystal (GMs.) | Yield % |
|---|---|---|---|
| 1 | 843 | 638 | 75.7 |
| 2 | 842 | 730 | 86.7 |
| 3 | 843 | 625 | 74.1 |
| 4 | 842 | 285 | 33.8 |
| 5 | 842 | 716 | 85.0 |
| 6 | 842 | 696 | 82.7 |
| 7 | 842 | 573 | 68.1 |
| 8 | 842 | 590 | 70.0 |
| Totals | 6738 | 4853 | 72.0 |

The invention described above represents a significant advance over the present technology for the seeded growth of single crystal gallium arsenide. The scope of the invention is not limited to gallium arsenide grown in a cylindrical boat but should be applicable to many materials grown in containers of various shapes. The technique results in not only in better single crystal yield but also gallium arsenide with better structure, that is lower dislocation density, lower incidence of lineage, low angle grain boundaries and poly. Runs are easier to prepare and results are less dependent on human judgment relative to melt level and seed orientation.

While the invention has been particularly shown and described with reference to a preferred embodiment thereof, it will be understood by those in the art that various changes in form and details may be made therein without departing from the spirit and scope of the invention. For example, the groove of the seed crystal holder may be triangular or cylindrical.

What is claimed is:

1. A reusable seed crystal holder adapted for use with a horizontally disposed crucible of generally cylindrical configuration formed from quartz tubing having a circular cross-section, said seed holder comprising a solid substantially half cylinder of quartz and adapted to fit snugly and removably within said crucible adjacent one end thereof whereby the entire curved bottom surface of said seed holder is in close-fitted contact with a portion of the interior surface of said crucible, said seed holder having a generally planar top surface, said top surface having a groove of substantially precisely uniform cross-sectional dimensions along its length for holding a seed crystal having the same cross section as said groove, said groove being disposed longitudinally in said seed holder and extending from a first end of said seed holder to the opposite second end of said seed holder, said first end being formed by a planar surface lying in a plane perpendicular to the axis of cylindricity of said seed holder, said second end being formed by a generally planar surface lying in a plane which is angled with respect to said axis of cylindricity such that said second end surface is sloped to form a ramp intersecting said top surface and said groove and extending downwardly and outwardly from the intersection with said top surface to the intersection with said bottom surface, the depth of said groove being substantially less than the radius of curvature of the bottom surface of said seed holder, said ramp being adapted to form one end wall of said crucible, whereby the surface level of an increasing volume of melt in said crucible is constrained to move up said ramp until it contacts a seed crystal in said groove and whereby said seed holder is adapted to prevent melt in said crucible from escaping from said one end of said crucible.

2. A seed holder as set forth in claim 1 wherein said groove is aligned with and parallel to the axis of cylindricity of said seed holder.

3. A seed holder as set forth in claim 1 wherein the cross-section of said groove is rectangular in shape.

4. A seed holder as set forth in claim 4 wherein the cross-section of said groove is triangular in shape.

5. A seed holder as set forth in claim 1 wherein the cross-section of said groove is cylindrical in shape.

* * * * *

UNITED STATES PATENT OFFICE
CERTIFICATE OF CORRECTION

Patent No. 3,944,393          Dated March 16, 1976

Inventor(s) Royce Gene Schierding et al.

It is certified that error appears in the above-identified patent and that said Letters Patent are hereby corrected as shown below:

On the Title Page, Item [54] "STRUCTURE" should read --- STRUCTURES ---.

Column 6, line 1, "4" should read --- 1 ---.

Signed and Sealed this

Fourth Day of January 1977

[SEAL]

Attest:

RUTH C. MASON
*Attesting Officer*

C. MARSHALL DANN
*Commissioner of Patents and Trademarks*